US005441767A

United States Patent [19]

DeSaulniers

[11] Patent Number: 5,441,767

[45] Date of Patent: Aug. 15, 1995

[54] PACK COATING PROCESS FOR ARTICLES CONTAINING SMALL PASSAGEWAYS

[75] Inventor: David E. DeSaulniers, North Hampton, Mass.

[73] Assignee: United Technologies Corporation, Hartford, Conn.

[21] Appl. No.: 187,590

[22] Filed: Jan. 26, 1994

[51] Int. Cl.[6] .............................................. C23C 16/00

[52] U.S. Cl. .................................... 427/252; 427/253; 427/156; 427/226; 427/419.7

[58] Field of Search ............ 427/252, 253, 156, 419.7, 427/226

[56] References Cited

U.S. PATENT DOCUMENTS

| | | | |
|---|---|---|---|
| 5,209,950 | 5/1993 | Schwartz et al. | 427/252 |
| 5,215,785 | 6/1993 | Strasser et al. | 427/252 |

*Primary Examiner*—Shrive Beck
*Assistant Examiner*—David M. Maiorana
*Attorney, Agent, or Firm*—Charles E. Sohl

[57] ABSTRACT

A method for reducing the tendencies of small holes to become packed with particulate material during pack cooling. An organic substance is used to wholly or partially fill small holes prior to placing the part in the packed cooling material. The organic material decomposes during the packed cooling process.

4 Claims, No Drawings

PACK COATING PROCESS FOR ARTICLES CONTAINING SMALL PASSAGEWAYS

TECHNICAL FIELD

The present invention relates to an improvement in the method of coating superalloy articles with a protective coating using a pack diffusion process. In particular, the present invention provides an improved process for coating superalloy articles having small holes and apertures therein.

BACKGROUND ART

Aluminide coatings have been well known for a number of years and are widely used to protect metallic surfaces from oxidation and corrosion. Aluminide coatings are widely used in gas turbine engines because they are economical and add little to the weight of the part. Aluminide coatings are applied by a pack diffusion (or pack cementation) process. Other coatings are also applied by pack processes including silicon and chromium as well as alloys based on aluminum, silicon, and chromium. Hereinafter, except were indicated, the term aluminide will be understood to encompass diffusion coatings based on aluminum, silicon, chromium and alloys and mixtures thereof.

Aluminide coatings are formed by diffusing aluminum into the surface of the superalloy article to produce an aluminum-rich surface layer which is resistant to oxidation. Superalloys are high-temperature materials based on nickel or cobalt. Examplary patents showing diffusion aluminide coating processes include U.S. Pat. No.: 3,625,750, U.S. Pat. No.: 3,837,901, and U.S. Pat. No.: 4,004,047 which are incorporated herein by reference. Typically, aluminide coatings are applied by a pack process. In a pack process a powder mixture including an inert ceramic material, a source of aluminum, and a halide activating compound is employed. The powder materials are well mixed and the parts to be coated are buried in the powder mix. During the coating process an inert or reducing gas is flowed through the pack and the pack is heated to an elevated temperature.

The pack coating process involves complex chemical reactions in which the halide activator reacts with the aluminum source to produce an aluminum-halide compound vapor which contacts the surface of the part. When the vapor contacts the superalloy surface it decomposes, leaving the aluminum on the surface while the halide is released to return to the aluminum source and continue the transport process. After the aluminum is deposited on the superalloy surface, it diffuses into the substrate. Diffusion is promoted by conducting the process at elevated temperatures, typically in the order of 1,500° F. to 2,000° F. In the case of silicon and chromium-based coatings, similar reactions occur.

In the case of nickel-base superalloys, which are the most widely used type of superalloys, and which are used extensively in gas turbine engines, the predominant material found in the aluminide layer is NiAl which is formed near the surface. Other nickel aluminum compounds are often found further below the surface as are compounds between aluminum and the alloy elements in superalloy, including e.g., cobalt, chromium, titanium, and refractory materials such as tungsten, tantalum, and molybdenum. In the case of chromium-based coatings, a chromium enriched surface layer forms while in the case of silicon-based coatings silicide compounds form.

In gas turbine engines the high turbine blades are invariably air-cooled to permit operation of the engine at higher temperatures. The cooling air is derived from air which is pressurized by the compressor section of the engine. As engine operating conditions increase in more modern engines, the temperature of the cooling air has increased to the point where such "cooling" air may actually have temperatures as high as 600° F. to 1,100° F. It has been observed that such high temperature cooling air causes undesirable oxidation on the internal cooling passages of the turbine blades and other air-cooled gas turbine engine hardware. Other gas turbine hardware made of superalloys, which also contain cooling holes and may be coated according to the present invention. These include vanes and air seals.

Thus, it is desired to coat the internal passages and cooling holes in the blade with the aluminide coating so as to reduce oxidation. These holes typically have a diameter from about 0.010 inches to about 0.025 inches and a depth of typically from about 0.030 inches to about 0.300 inches. The cooling holes are of a small diameter to improve cooling efficiency.

A significant practical problem is encountered in the pack coating of gas turbine engine hardware having such fine holes. At the conclusion of the coating process, the particulate material in the coating pack is found to be firmly packed in the fine passageways. Microscopic examination suggests that the fine particulate material is sintered together and to the walls of the passageways during the coating process, and probably during the cooling cycle from the coating process, by a reaction involving the halide activating material. In addition, the difference in the coefficient of thermal expansion between the particulate pack coating material which is mainly a ceramic material and the superalloy article is fairly large. It is possible this differential thermal contraction may contribute to the packing process.

In any event, removal of the material from the cooling holes after coating is a major problem. Various schemes such as chemical dissolution, grit blasting, and mechanical means are employed. Most commonly, hand removal of the powder material is performed. Since each blade may contain 100 to 300 cooling holes, the time required to probe each passageway with a thin piano wire probe to remove the sintered pack material is significant. Further, even assuming that the time was not a factor, it is often found that the material can simply not be removed by mechanical means and that the holes must be redrilled (and of course, the redrilled holes will not have a protective coating on their walls).

DISCLOSURE OF THE INVENTION

The present invention comprises a pre-treatment process which largely eliminates the packing and sintering of the pack coating material in the cooling holes of the gas turbine engine hardware during the pack coating process. According to the invention, the cooling holes and other similar small intricate passages are filled in whole or in part with an organic material. The organic material serves to partly or completely eliminate the intrusion of the pack coating material into the fine holes during the coating process. During the heat-up portion of the coating cycle to the pack aluminizing temperature, the organic material decomposes to harmless vapors which exit the pack with the flow of the inert or reducing gases which are part of the normal pack coating process. These same inert or reducing gases serve to carry the aluminum vapor into the passageways, regardless of whether the passageways contain the pack material or not. Thus, the internal walls of the passageways are aluminized during the process. At the conclusion of the process it is found that the pack material can readily be removed from the passages, often with a simple application of compressed air.

The organic material is applied as a liquid and then solidifies to a durable state which will prevent the pack coating materials from completely filling the passageways. The function of the organic material is to reduce the packing density of the pack coating material in the passageways. The organic material performs a physical rather than a chemical function. Thus, there are a wide range of materials from which the organic material can be selected.

A primary requirement of the organic material is that it decompose without producing vapors which interfere with the coating process and without leaving behind a residue which would contaminate the superalloy surface or otherwise interfere with the diffusion of aluminum into that surface. Heavy metals such a Pb, Sn, Bi, and Hg and reactive elements such as S should be avoided, also a low carbon residual is desired.

A preferred characteristic of the organic material is that it be water soluble rather than soluble in an organic solvent. This preference is related to the desire to reduce atmospheric contamination with volatile organic vapors. The organic material preferably has a viscosity at the application conditions of between 500 centistokes and 100 centistokes. Materials with this viscosity flow properly into cooling holes having the previously mentioned dimensions.

We prefer to use water soluble polymers. Such polymers include natural, semi-synthetic, and synthetic polymers. Natural, water soluble polymers include arabic, tragacanth, and karaya. The semi-synthetic water soluble polymers Carboxymethyl cellulose, methyl cellulose, and modified starches such as ethers and acetates. The synthetic water soluble polymers include polyvinyl alcohol, ethylene oxide polymers, polyvinyl pyrrolidone, and polyethyleneimine. The previous recitation is meant to be exemplary rather than limiting. In addition to true solvent-base materials, suspensions such as emulsions can be used. For example, latex, a colloidal suspension of hydrocarbon polymers in water can be used.

A host of other organic materials can be conceived of, especially if one also includes the organic soluble materials. Such materials include shellac, varnishes, silicones, rubbers, materials such as rubber cement, and the like. As previously indicated, these materials are functional in the context of the present invention but are not desired for reasons external to the direct function of the invention.

The previously-mentioned materials are all materials which are soluble in a solvent (except for emulsions), and which solidify by evaporation. Materials which are liquid at the time of application and solidify by a chemical reaction such as the epoxies may also be used. It is also possible to consider the use of thermo plastic materials such as waxes. Such materials can be melted at a relatively low temperature and applied by brushing or immersion and then solidify upon cooling.

After an appropriate fugitive organic material has been selected, and prepared in the right viscosity, it is applied to the part, preferably by brushing, although immersion and spraying are also possible alternatives. The organic material will be preferentially retained in the fine passages by surface tension. Any excess organic material can be removed from the surface of the part, for example, rubbing with a sprayer cloth, by air blasting with materials such as walnut shells, etc., or possibly by a short immersion in an appropriate solvent.

While it is preferred to remove the excess organic material from the surface of the parts, this is in fact not essential since the nature of the pack coating process, a process which works through vapor transport of aluminum to the surface, makes the process effective even if gaps and spaces are present between the surface to be coated and the pack coating material.

The invention has been used in circumstances and with organic materials which produce essentially complete blockage of the fine cooling holes and with lower viscosity organic materials which only produce a coating on the internal surface of the holes. Both alternatives seem to work well and neither is preferred over the other. For the circumstance in which the organic material forms a coating on the internal surfaces of the hole, coating thicknesses of at least 0.0005 inches are preferred and preferably a coating of at least 0.0010 inches are more preferred.

These and other features and benefits of the invention will be more readily understood through consideration of the following description of the drawings and detailed description of the invention.

BEST MODE FOR CARRYING OUT THE INVENTION

The pack coating process for the application of aluminide coatings is well known, however it will be briefly described below. The pack for the application of aluminide coatings contains a source of aluminum, a halide activator, and an inert ceramic material.

A number of aluminum sources are possible for use in pack coatings which can be practiced in accordance with the present invention, for example, pure aluminum powder may be used. Alloys of aluminum may also be used, for example, aluminum—10% silicon is used in conventional pack aluminide coatings and will function well in the present invention. U.S. Pat. No.: 5,000,782 describes the use of an aluminum yttrium silicon alloy containing from 2% weight to 20% weight yttrium, from 6% to 50% of a material selected from the group consisting of silicon, chromium, cobalt, nickel, titanium, and mixtures thereof balance aluminum. In this latter instance, the resultant aluminide coating contains a mixture of aluminum and yttrium. The yttrium provides benefits in enhanced oxidation resistance. These prior patents are incorporated herein by reference. Finally, aluminum compounds may be used, for example $CO_2AL_5$, CrAl, and $Fe_2Al_5$ are known as aluminum sources for pack coating processes and will work well in the present invention.

The halide activator compound can be any one of the large number of halide compounds, including for example aluminum fluoride, sodium fluoride, sodium chloride, sodium bromide, sodium iodine, ammonium fluoride, ammonium bifluoride, ammonium chloride, potassium fluoride, potassium chloride, potassium bromide, and potassium iodine. Mixtures of these halide compounds may also be used as well as complex compounds such as $Na_3Alf_6$. These compound activators are described in U.S. Pat. No.: 4,156,042 which is incorporated herein by reference. The inert material is typically alumina. The extent of the sintering problem varies somewhat with the activator used and is quite pronounced with the ammonium bifluoride activators.

The present invention will be better understood through consideration of the following illustrative example. It was desired to coat turbine blades containing a plurality of 0.015 in diameter holes with a pack aluminide coating. An organic material known as Kelzan TM was employed to coat the holes prior to aluminizing. Kelzan TM is a product of the KelCo Company of San Diego, Calif., division of Merck & Company. The Kelzan TM material is a seaweed derivative and is a water soluble high molecular-weight polymer supplied in powder form. The Kelzan TM powder was mixed with water using a rotary mixer. Approximately 2.0% to 5.0% by mass, Kelzan TM, and 95% to 98% by mass, water were employed and the resultant material was mixed until it thickened to a viscosity thicker than that of honey.

A fine bristle paintbrush was used to apply this material to the exterior surface of the turbine blades in the region where the holes intersected with the outer surface. The paintbrush was manipulated so as to force the Kelzan TM mixture into the cooling holes to the extent possible. Initial experiments used multiple Kelzan TM applications with intervening drying steps in a heated oven to drive off the aqueous binder. In initial experiments the holes were completely filled with Kelzan TM material. Subsequent experiments used fewer Kelzan TM coats, and it has been found that a Kelzan TM coat having a thickness after drying of as little as 0.001 inches can be effective in reducing sintering of the pack material to the cooling hole walls during the aluminide coating process.

The blade with the partially filled cooling passages was emersed in a pack mixture containing (by weight) 8% al, 22% Cr, ½% to ½% ammonium bifluoride, balance 60 mesh alumina powder.

The embedded blades were contained in a superalloy sheet metal container which was placed in a furnace with a flowing atmosphere of argon and heated to 2,025° F. for 26 hours. At the conclusion of this temperature cycle, the blades were removed and the pack material was removed from the surface of the blades with a gentle grip-blasting application.

It was found that grip blasting, using a grip-blasting gun with 2.40 mesh $Al_2O_3$ abrasive operated at 20 psi air pressure could completely remove the pack material from the cooling holes without any appreciable damage to the aluminide coating. Prior to the use of the organic hole pre-coat treatment, the same abrasive applied by the same abrasive gun with air pressures up to 80 psi was generally ineffective at removing the pack material after the coating process. In addition, use of air pressures in excess of about 50 psi were found to deleteriously effect the coating.

A typical blade coated according to the prior art without the preliminary organic coating was found to require approximately 2 to 10 hours of hand labor to laboriously probe and remove the pack material from the cooling holes. Often this was found to be impossible and the material had to be removed through chemical means or by redrilling the holes at substantial cost. Thus, according to the present invention, the amount of labor and costs involved at removing the pack material from the cooling holes after the pack coating process is substantially reduced.

Photo microscopic examination of cut-up turbine engine blades reveals that the internal cooling hole walls were protected with an effective amount of aluminum.

Although this invention has been shown and described with respect to detailed embodiments thereof, it will be understood by those skilled in the art that various changes, omissions and additions in form and detail thereof may be made without departing from the spirit and scope of the claimed invention.

I claim:

1. In the method of coating metallic articles containing cooling holes with a protective coating by embedding the article in a powder mix which contains a source of the protective coating constituents, a halide activator and an inert ceramic material and heating the article and powder mix to an elevated temperature, such as between about 1,500° F. and about 2,025° F., the improvement which comprises partially filling said cooling holes with an aqueous base organic coating prior to embedding the article in the powder mix, whereby the tendency of the powder mix to sinter within the cooling holes is reduced.

2. The method of coating as in claim 1 wherein the organic material is a water-soluble high polymer.

3. The method as in claim 2 wherein the organic material is a water-soluble kelp base derivative.

4. The method as in claim 1 wherein the halide activator is ammonium bifluoride.

* * * * *